(12) United States Patent
Kishimoto et al.

(10) Patent No.: US 11,770,111 B2
(45) Date of Patent: Sep. 26, 2023

(54) ELASTIC WAVE DEVICE

(71) Applicant: Murata Manufacturing Co., Ltd., Nagaokakyo (JP)

(72) Inventors: Yutaka Kishimoto, Nagaokakyo (JP); Tetsuya Kimura, Nagaokakyo (JP); Masashi Omura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1530 days.

(21) Appl. No.: 15/922,960

(22) Filed: Mar. 16, 2018

(65) Prior Publication Data

US 2018/0205361 A1 Jul. 19, 2018

Related U.S. Application Data

(63) Continuation of application No. PCT/JP2016/071725, filed on Jul. 25, 2016.

(30) Foreign Application Priority Data

Oct. 23, 2015 (JP) ................. 2015-208802

(51) Int. Cl.
*H03H 9/02* (2006.01)
*H03H 3/02* (2006.01)
(Continued)

(52) U.S. Cl.
CPC .......... *H03H 9/02897* (2013.01); *H03H 3/02* (2013.01); *H03H 9/02133* (2013.01);
(Continued)

(58) Field of Classification Search
CPC .......... H03H 9/02897; H03H 9/02559; H03H 9/02535
(Continued)

(56) References Cited

U.S. PATENT DOCUMENTS

2009/0045704 A1 2/2009 Barber et al.
2011/0041987 A1 2/2011 Hori et al.
(Continued)

FOREIGN PATENT DOCUMENTS

CN 103283147 A 9/2013
CN 103718457 A 4/2014
(Continued)

OTHER PUBLICATIONS

Official Communication issued in International Patent Application No. PCT/JP2016/071725, dated Oct. 11, 2016.
(Continued)

*Primary Examiner* — Derek J Rosenau
(74) *Attorney, Agent, or Firm* — KEATING & BENNETT, LLP

(57) ABSTRACT

An elastic wave device includes a supporting substrate, an acoustic multilayer film on the supporting substrate, a piezoelectric substrate on the acoustic multilayer film, and an IDT electrode on the piezoelectric substrate. An absolute value of a thermal expansion coefficient of the piezoelectric substrate is larger than an absolute value of a thermal expansion coefficient of the supporting substrate. The acoustic multilayer film includes at least four acoustic impedance layers. The elastic wave device further includes a bonding layer provided at any position in a range of from inside the first acoustic impedance layer from the piezoelectric substrate side towards the supporting substrate side, to an interface between the third acoustic impedance layer and the fourth acoustic impedance layer.

18 Claims, 5 Drawing Sheets

(51) Int. Cl.
*H03H 9/17* (2006.01)
*H10N 30/87* (2023.01)
*H10N 30/88* (2023.01)
*H10N 30/853* (2023.01)
*H03H 9/05* (2006.01)
*H03H 9/145* (2006.01)
*H03H 9/64* (2006.01)

(52) U.S. Cl.
CPC .... *H03H 9/02228* (2013.01); *H03H 9/02559* (2013.01); *H03H 9/0585* (2013.01); *H03H 9/14538* (2013.01); *H03H 9/175* (2013.01); *H10N 30/8536* (2023.02); *H10N 30/8542* (2023.02); *H10N 30/877* (2023.02); *H10N 30/883* (2023.02); *H03H 9/6406* (2013.01); *H03H 2003/025* (2013.01)

(58) Field of Classification Search
USPC ...... 310/313 R, 313 A, 313 B, 313 C, 313 D
See application file for complete search history.

(56) References Cited

U.S. PATENT DOCUMENTS

2012/0274179 A1* 11/2012 Nodake .................... H03H 3/04
310/313 C
2013/0271238 A1 10/2013 Onda et al.
2013/0285768 A1* 10/2013 Watanabe ................ H03H 3/02
333/193
2014/0139075 A1 5/2014 Iwamoto
2014/0152146 A1* 6/2014 Kimura ............... H01L 41/1873
310/313 B
2014/0225684 A1* 8/2014 Kando ............... H03H 9/14594
333/195
2015/0231884 A1* 8/2015 Kobayashi ........... B41J 2/14201
347/70

FOREIGN PATENT DOCUMENTS

| JP | 2013-223025 A | 10/2013 |
| JP | 2013-258373 A | 12/2013 |
| KR | 10-2010-0057803 A | 6/2010 |
| KR | 10-2011-0020741 A | 3/2011 |
| WO | 2012/086441 A1 | 6/2012 |
| WO | 2012/086639 A1 | 6/2012 |

OTHER PUBLICATIONS

Official Communication issued in corresponding Chinese Patent Application No. 201680055300.7, dated Sep. 22, 2020.

* cited by examiner

ELASTIC WAVE DEVICE

CROSS REFERENCE TO RELATED APPLICATIONS

This application claims the benefit of priority to Japanese Patent Application No. 2015-208802 filed on Oct. 23, 2015 and is a Continuation Application of PCT Application No. PCT/JP2016/071725 filed on Jul. 25, 2016. The entire contents of each application are hereby incorporated herein by reference.

BACKGROUND OF THE INVENTION

1. Field of the Invention

The present invention relates to an elastic wave device for use in a resonator, a bandpass filter, or other suitable devices.

2. Description of the Related Art

Heretofore, elastic wave devices have been widely used in resonators and bandpass filters. In such elastic wave devices, various elastic waves, such as Rayleigh waves and shear horizontal (SH) waves, are used.

In WO 2012/086441 A1, an elastic wave device that uses a plate wave is disclosed. In the elastic wave device described in WO 2012/086441 A1, an acoustic reflector layer, a piezoelectric layer, and an IDT electrode are stacked on a supporting substrate in that order. In WO 2012/086441 A1, when producing the elastic wave device, a piezoelectric is bonded to the supporting substrate with the acoustic reflector layer stacked thereon.

In WO 2012/086639 A1, an elastic wave device in which a high acoustic velocity film, a low acoustic velocity film, and a piezoelectric film are stacked on a supporting substrate in that order is disclosed. In WO 2012/086639 A1, when producing the elastic wave device, the supporting substrate is bonded to a multilayer body in which the piezoelectric film, the low acoustic velocity film, and the high acoustic velocity film are stacked.

However, an elastic wave device obtained by a method including bonding a piezoelectric to a supporting substrate on which an acoustic reflector layer is stacked, as in WO 2012/086441 A1, may undergo deterioration of characteristics.

In contrast, when a supporting substrate and other elements are bonded by the bonding method described in WO 2012/086639 A1, many films must be formed on the piezoelectric film side. When many films are formed on the piezoelectric film side, stress is generated in the films, and the piezoelectric film may warp. Thus, the characteristics of the elastic wave device described in WO 2012/086639 A1 also deteriorate in some cases.

SUMMARY OF THE INVENTION

Preferred embodiments of the present invention provide elastic wave devices in each of which warpage of a piezoelectric substrate and deterioration of the characteristics are unlikely to occur.

An elastic wave device according to a preferred embodiment of the present invention includes a supporting substrate, an acoustic multilayer film on the supporting substrate, a piezoelectric substrate on the acoustic multilayer film, and an IDT electrode on the piezoelectric substrate. An absolute value of a thermal expansion coefficient of the piezoelectric substrate is larger than an absolute value of a thermal expansion coefficient of the supporting substrate. The acoustic multilayer film includes at least four acoustic impedance layers. The at least four acoustic impedance layers include at least one low acoustic impedance layer and at least one high acoustic impedance layer having an acoustic impedance higher than the low acoustic impedance layer. The elastic wave device further includes a bonding layer provided at any position in a range of from inside the first acoustic impedance layer from the piezoelectric substrate side towards the supporting substrate side, to an interface between the third acoustic impedance layer and the fourth acoustic impedance layer.

In an elastic wave device according to a preferred embodiment of the present invention, the bonding layer is provided inside one acoustic impedance layer selected from the first to third acoustic impedance layers from the piezoelectric substrate side towards the supporting substrate side.

In an elastic wave device according to a preferred embodiment of the present invention, the bonding layer is provided at an interface between any two adjacent acoustic impedance layers among the first to fourth acoustic impedance layers from the piezoelectric substrate side towards the supporting substrate side.

In an elastic wave device according to a preferred embodiment of the present invention, a plate wave of an $S_0$ mode, an $A_0$ mode, an $A_1$ mode, an $SH_0$ mode, or an $SH_1$ mode is used as a propagating elastic wave.

In an elastic wave device according to a preferred embodiment of the present invention, the bonding layer has a thickness of about 5 nm or less. In this case, deterioration of the characteristics is further reduced or prevented.

In an elastic wave device according to a preferred embodiment of the present invention, the bonding layer also defines and functions as an insulating layer. In this case, deterioration of the characteristics is further reduced or prevented.

In an elastic wave device according to a preferred embodiment of the present invention, the supporting substrate is made of glass or Si, and the piezoelectric substrate is made of $LiNbO_3$ or $LiTaO_3$. In this case, warpage of the piezoelectric substrate is further reduced or prevented.

In an elastic wave device according to a preferred embodiment of the present invention, the low acoustic impedance layer is made of silicon oxide. In this case, the plate wave is able to be more efficiently confined.

In an elastic wave device according to a preferred embodiment of the present invention, the high acoustic impedance layer is made of tungsten, platinum, tantalum, silicon nitride, or aluminum nitride. In this case, the plate wave is able to be more efficiently confined.

According to preferred embodiments of the present invention, elastic wave devices in each of which warpage of a piezoelectric substrate and deterioration of the characteristics are unlikely to occur are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will now be described with reference to the drawings.

It should be noted that the preferred embodiments described in this description are only exemplary, and partially substituting or combining the features of different preferred embodiments is possible.

First Preferred Embodiment

Figure 1A:
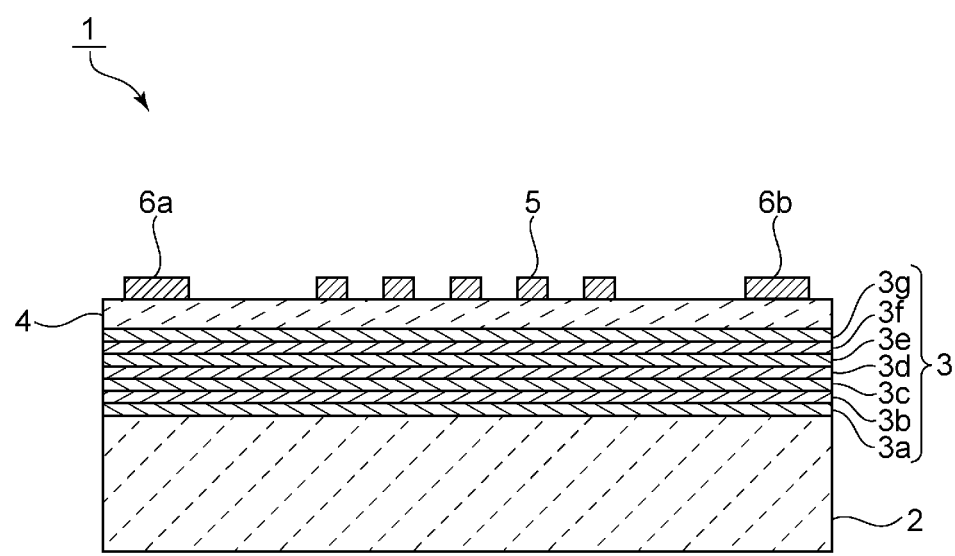
FIG. 1A is a schematic elevational cross-sectional view of an elastic wave device according to a first preferred embodiment of the present invention.
Figure 1B:
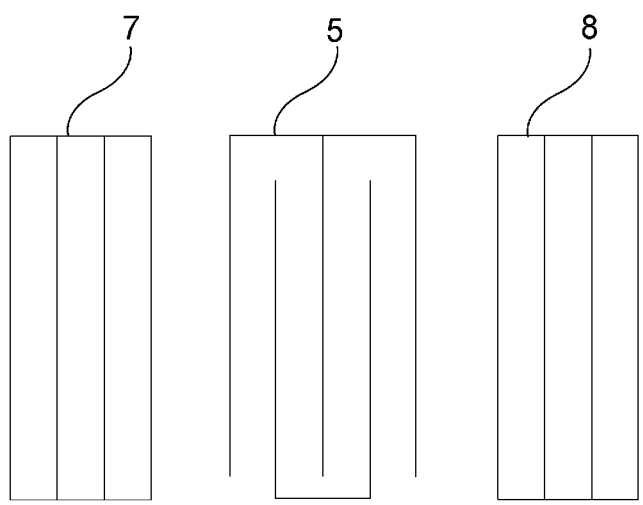
FIG. 1B is a schematic plan view of an electrode structure of the elastic wave device.
Figure 2:
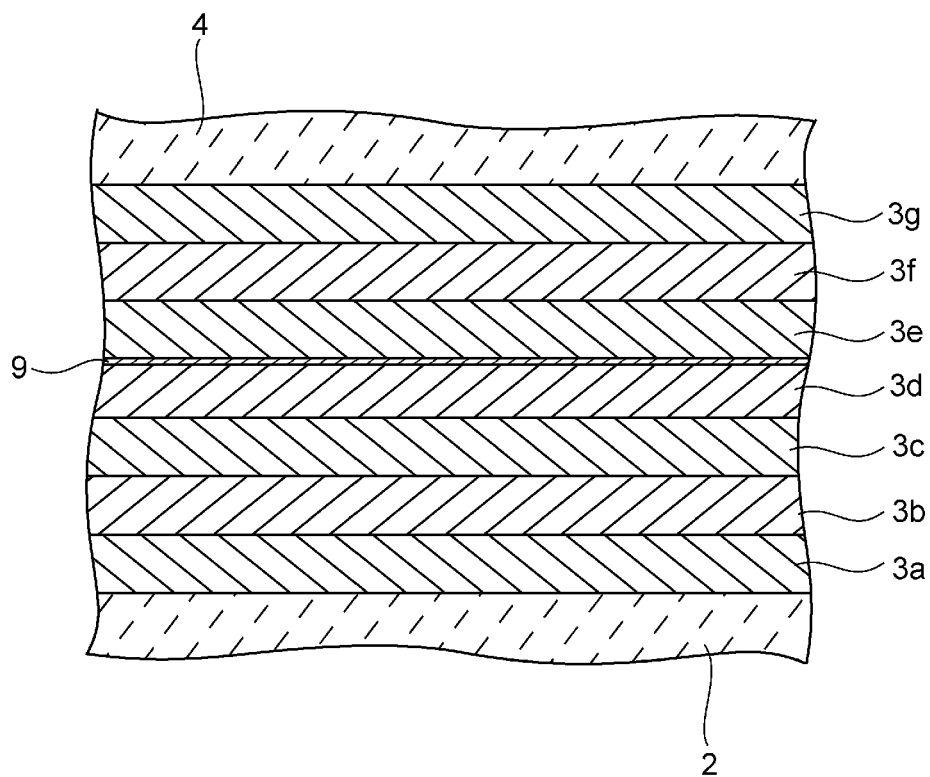
FIG. 2 is a partially cut-away schematic cross-sectional view illustrating an enlarged relevant portion of the elastic wave device of the first preferred embodiment of the present invention.

FIG. 1A is a schematic elevational cross-sectional view of an elastic wave device according to a first preferred embodiment of the present invention, and FIG. 1B is a schematic plan view of an electrode structure thereof. FIG. 2 is a partially cut-away schematic cross-sectional view illustrating an enlarged relevant portion of the elastic wave device of the first preferred embodiment of the present invention.

An elastic wave device 1 uses a plate wave of an S$_0$ mode, an A$_0$ mode, an A$_1$ mode, an SH$_0$ mode, an SH$_1$ mode, or other suitable mode. The elastic wave device 1 includes a supporting substrate 2. An acoustic multilayer film 3 is stacked on the supporting substrate 2. A piezoelectric substrate 4 is stacked on the acoustic multilayer film 3. An IDT electrode 5 and electrode lands 6a and 6b are stacked on the piezoelectric substrate 4. The electrode lands 6a and 6b are electrically coupled to the IDT electrode 5.

The supporting substrate 2 is preferably made of Si, for example. The material from which the supporting substrate 2 is made is not particularly limited. Examples of the material that may be used include piezoelectrics, such as sapphire, LiTaO$_3$, LiNbO$_3$, and crystal; dielectrics, such as various ceramics and glass, e.g., alumina, magnesia, silicon nitride, aluminum nitride, silicon oxide, aluminum oxide, silicon carbide, zirconia, cordierite, mullite, steatite, and forsterite; semiconductors, such as silicon and gallium nitride; and resins.

The acoustic multilayer film 3 of the present preferred embodiment includes low acoustic impedance layers 3a, 3c, 3e, and 3g, and high acoustic impedance layers 3b, 3d, and 3f. The acoustic impedance of the high acoustic impedance layers 3b, 3d, and 3f is higher than the acoustic impedance of the low acoustic impedance layers 3a, 3c, 3e, and 3g. In the present preferred embodiment, the low acoustic impedance layers 3a, 3c, 3e, and 3g and the high acoustic impedance layers 3b, 3d, and 3f are alternately arranged in the stacking direction. Thus, the plate wave propagating from the piezoelectric substrate 4 is reflected at the interfaces between the low acoustic impedance layers 3a, 3c, 3e, and 3g and the high acoustic impedance layers 3b, 3d, 3f, the interfaces being the upper surfaces of the low acoustic impedance layers 3a, 3c, 3e, and 3g. In this manner, the energy of the plate wave is efficiently confined.

In preferred embodiments of the present invention, the low acoustic impedance layers 3a, 3c, 3e, and 3g and the high acoustic impedance layers 3b, 3d, and 3f need not be arranged alternately in the stacking direction. From the viewpoint of further improving the plate wave confining efficiency, at least one of the low acoustic impedance layers 3a, 3c, 3e, and 3g is preferably provided on the piezoelectric substrate 4 side with respect to at least one of the high acoustic impedance layers 3b, 3d, and 3f. More preferably, the low acoustic impedance layers 3a, 3c, 3e, and 3g and the high acoustic impedance layers 3b, 3d, and 3f are alternately arranged in the stacking direction.

The low acoustic impedance layers 3a, 3c, 3e, and 3g and the high acoustic impedance layers 3b, 3d, and 3f preferably have acoustic impedance values that satisfy the relationship, high acoustic impedance layer>low acoustic impedance layer, and the materials therefor may be any as long as this relationship is satisfied.

In the present preferred embodiment, the acoustic multilayer film 3 preferably includes seven acoustic impedance layers, for example. However, the number of acoustic impedance layers that are stacked may be any as long as the number is 4 or more. The upper limit of the number of the acoustic impedance layers stacked is not particularly limited, but is preferably about 20, for example. Since the elastic wave device includes an acoustic multilayer film that includes at least four acoustic impedance layers, the plate wave is able to be highly efficiently confined. This will now be described in detail with reference to Experimental Example 1.

In Experimental Example 1, an elastic wave device 1, which is a one-port-type elastic wave resonator, was prepared under the following conditions, and, for example, a S$_0$-mode plate wave was excited.

Supporting substrate 2: Si Substrate

Acoustic multilayer film 3: number of layers stacked: 2, 4, or 6, low acoustic impedance layer: SiO$_2$, high acoustic impedance layer: Pt, film thickness of each layer: SiO$_2$: about 240 nm, Pt: about 150 nm Piezoelectric substrate 4: X-cut —LiNbO$_3$ {Euler angles (90°, 90°, 40°)}

IDT electrode 5: AlCu (Cu about 1%)/Ti, duty ratio: about 0.5, number of pairs of electrode fingers: 100, intersecting width: about 25 μm, wavelength (λ) determined by electrode finger pitch: about 1.7 μm FIG. 3 is a graph illustrating the relationship between the thickness of the piezoelectric substrate 4 (LiNbO$_3$) and the impedance ratio (Za/Zr) when the number of acoustic impedance layers that are stacked to define the acoustic multilayer film is varied.

Figure 3:
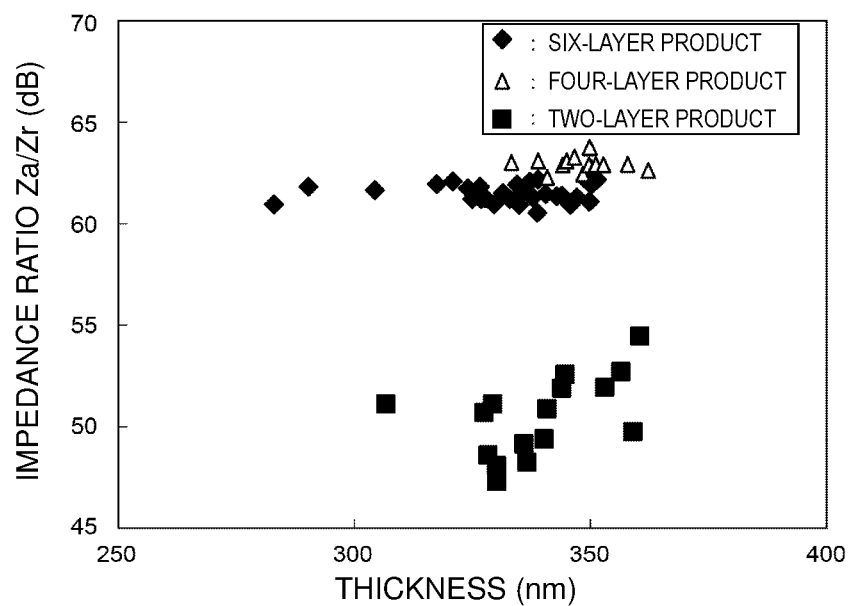
FIG. 3 is a graph illustrating the relationship between the thickness of the piezoelectric substrate and the impedance ratio (Za/Zr) when the number of acoustic impedance layers that are stacked to define the acoustic multilayer film is varied in Experimental Example 1.

FIG. 3 demonstrates that good impedance characteristics are obtained in the elastic wave devices 1 with four and six stacked acoustic impedance layers as compared to the elastic wave device 1 with two stacked acoustic impedance layers. This shows that in order to efficiently confine the plate wave and obtain good impedance characteristics, at least four acoustic impedance layers are preferable.

As described above, the acoustic multilayer film preferably includes at least four acoustic impedance layers. In this manner, the plate wave is able to be efficiently confined. The acoustic multilayer film may further include an additional layer or layers, such as a layer made of $TiO_2$ or other suitable material, as long as at least four acoustic impedance layers are included.

From the viewpoint of further efficiently confining the energy of the plate wave, the thickness of each of the acoustic impedance layers defining the acoustic multilayer film 3 is preferably in the range of about ¼ of the thickness of the piezoelectric substrate 4 to about 10 times the thickness of the piezoelectric substrate 4, for example. However, the thickness of each of the acoustic impedance layers is not particularly limited.

The low acoustic impedance layers 3a, 3c, 3e, and 3g are preferably made of $SiO_2$, for example. Alternatively, the low acoustic impedance layers 3a, 3c, 3e, and 3g may be made of Al, Ti, or other suitable material, for example.

The high acoustic impedance layers 3b, 3d, and 3f are preferably made of Pt, for example. Alternatively, the high acoustic impedance layers 3b, 3d, and 3f may be made of AlN, W, $LiTaO_3$, $Al_2O_3$, $LiNbO_3$, Ta, SiN, ZnO, or other suitable material, for example.

As illustrated in the enlarged view of FIG. 2, in the present preferred embodiment, a bonding layer 9 is provided at the interface between the low acoustic impedance layer 3e and the high acoustic impedance layer 3d. In other words, the bonding layer 9 is provided at the interface between the acoustic impedance layer 3e, which is the third acoustic impedance layer from the piezoelectric substrate 4 side towards the supporting substrate 2 side, and the acoustic impedance layer 3d, which is the fourth acoustic impedance viewed in the same manner. Thus, in the present preferred embodiment, the bonding layer 9 is not provided directly below the piezoelectric substrate 4.

The bonding layer 9 is preferably made of a Ti oxide, for example. Thus, in the present preferred embodiment, the bonding layer 9 is an insulating layer. Note that the material for the bonding layer 9 is not limited to the Ti oxide, and may be an oxide of other metals, such as Al, for example. Alternatively, instead of a metal oxide, metal, such as Ti or Al, for example, may be used for the bonding layer 9. In order to enable electrical insulation, a metal oxide or a metal nitride is preferable. In particular, an oxide or nitride of Ti is preferable for its high bonding strength.

The thickness of the bonding layer 9 may be any thickness, but is preferably about 5 nm or less, for example. When the bonding layer 9 is an insulating layer and the thickness of the bonding layer 9 is set within the above-described range as in the present preferred embodiment, deterioration of the characteristics of the elastic wave device 1 is further reduced or prevented.

The piezoelectric substrate 4 is preferably made of $LiNbO_3$, for example. Thus, the absolute value of the thermal expansion coefficient of the piezoelectric substrate 4 is larger than the absolute value of the thermal expansion coefficient of the supporting substrate 2 made of Si. The piezoelectric substrate 4 is not particularly limited as long as the absolute value of the thermal expansion coefficient is larger than that of the supporting substrate 2. A substrate made of a different piezoelectric single crystal, such as $LiTaO_3$, or a substrate made of a piezoelectric ceramic, for example, may be used as the piezoelectric substrate 4.

However, as in the present preferred embodiment, a substrate made of glass or Si is preferably used as the supporting substrate 2, and a substrate made of $LiNbO_3$ or $LiTaO_3$ is preferably used as the piezoelectric substrate 4. In this case, because the difference in the absolute value of the thermal expansion coefficient is decreased, warpage of the piezoelectric substrate 4 is further reduced or prevented.

Although FIG. 1A only schematically shows an electrode structure, an electrode structure illustrated in FIG. 1B is preferably provided on the piezoelectric substrate 4. In other words, the IDT electrode 5 and reflectors 7 and 8, which are located on both sides of the IDT electrode 5 in the elastic wave propagation direction, are provided. As a result, a one-port-type elastic wave resonator is provided. However, the reflectors 7 and 8 are optional.

As illustrated in FIG. 1B, the IDT electrode 5 includes a first bus bar, a second bus bar, a plurality of first electrode fingers, and a plurality of second electrode fingers. The first electrode fingers and the second electrode fingers are interdigitated. The first electrode fingers are connected to the first bus bar, and the second electrode fingers are connected to the second bus bar.

When an alternating voltage is applied to the IDT electrode 5, the portion of the piezoelectric substrate 4 in which the IDT electrode 5 is provided is excited. The elastic wave device 1 uses the plate wave as the elastic wave generated by excitation of the IDT electrode 5 as described above.

Although omitted from the drawings of the present preferred embodiment, a $SiO_2$ film or a SiN film, which defines and functions as a temperature adjusting film, may be provided to cover the IDT electrode 5.

The IDT electrode 5 and the electrode lands 6a and 6b are preferably made of Al in the present preferred embodiment. The IDT electrode 5 and the electrode lands 6a and 6b may be made of any appropriate metal, such as Al, Cu, Pt, Au, Ag, Ti, Ni, Cr, Mo, or W, or an alloy primarily including any of these metals, for example. The IDT electrode 5 and the electrode lands 6a and 6b may be made of a multilayer metal film obtained by stacking a plurality of metal films.

Since the number of acoustic impedance layers stacked in the elastic wave device 1 of the present preferred embodiment is at least 4, the plate wave is efficiently confined. Furthermore, in the elastic wave device 1, the bonding layer 9 is provided at the interface between the acoustic impedance layer 3e, which is the third acoustic impedance layer from the piezoelectric substrate 4 side towards the supporting substrate 2 side, and the acoustic impedance layer 3d, which is the fourth acoustic impedance layer viewed in the same manner. Thus, when the piezoelectric substrate 4 is bonded to the supporting substrate 2 during production, warpage of the piezoelectric substrate 4 is unlikely to occur. Moreover, warpage of the piezoelectric substrate 4 in the elastic wave device 1 obtained as a final product is also unlikely to occur. Thus, deterioration of the characteristics rarely occurs. This will now be specifically described by describing a production method.

Although the method for producing the elastic wave device 1 is not particularly limited, one non-limiting example of a method according to a preferred embodiment of the present invention is described with reference to FIGS. 4A to 4D.

Figure 4A:
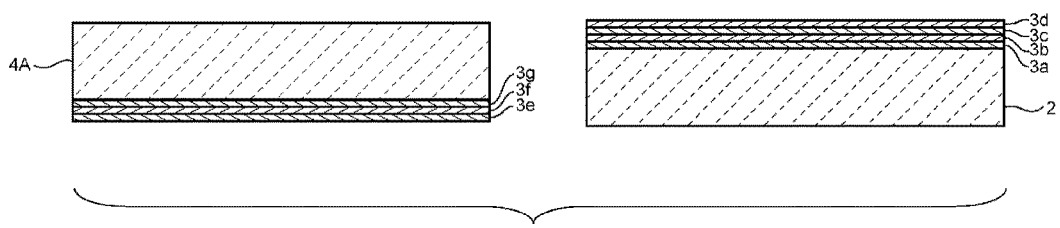
FIGS. 4A to 4D are each a schematic elevational cross-sectional view illustrating a method for producing the elastic wave device according to the first preferred embodiment of the present invention.

First, as illustrated in FIG. 4A, a piezoelectric substrate 4A and a supporting substrate 2 are prepared. A low acoustic impedance layer 3g preferably formed of $SiO_2$ is formed on one main surface of the piezoelectric substrate 4A. Then, a high acoustic impedance layer 3f preferably formed of SiN and a low acoustic impedance layer 3e preferably formed of $SiO_2$ are sequentially stacked in that order on the low acoustic impedance layer 3g. As a result, a multilayer film is formed on the piezoelectric substrate 4A.

Two low acoustic impedance layers 3a and 3c formed of $SiO_2$ and two high acoustic impedance layers 3b and 3d formed of SiN are alternately stacked on one main surface of the supporting substrate 2 starting from the low acoustic impedance layer 3a formed of $SiO_2$. As a result, a multilayer film is formed on the supporting substrate 2.

At least the high acoustic impedance layer 3d formed of SiN is to be formed as the topmost layer of the multilayer film on the supporting substrate 2. In this case, the elastic wave device 1 including four acoustic impedance layers is obtained when combined with three acoustic impedance layers on the piezoelectric substrate 4A. Acoustic impedance layers may be formed between the supporting substrate 2 and the high acoustic impedance layer 3d as in the present preferred embodiment. Alternatively, an additional layer or layers may be formed between the supporting substrate 2 and the high acoustic impedance layer 3d. An example of the additional layer may preferably be a layer formed of $TiO_2$.

A plate made of $LiNbO_3$, for example, is preferably used as the piezoelectric substrate 4A. However, a substrate made of a different piezoelectric single crystal, such as $LiTaO_3$, or a substrate composed of a piezoelectric ceramic, for example, may be used as the piezoelectric substrate 4A.

Silicon (Si) is preferably used in the supporting substrate 2. However, piezoelectrics such as sapphire, $LiTaO_3$, $LiNbO_3$, and crystal, dielectrics such as various ceramics and glass, such as, alumina, magnesia, silicon nitride, aluminum nitride, silicon oxide, aluminum oxide, silicon carbide, zirconia, cordierite, mullite, steatite, and forsterite, and semiconductors such as silicon and gallium nitride, resins, for example, may be used in the supporting substrate 2.

The low acoustic impedance layers 3a, 3c, 3e, and 3g and high acoustic impedance layers 3b, 3d, and 3f may be formed by a sputtering method, a vapor deposition method, a CVD method, or other suitable method, for example. The thickness of each of the low acoustic impedance layers 3a, 3c, 3e, and 3g and the high acoustic impedance layers 3b, 3d, and 3f is not particularly limited, and may preferably be about 50 nm to about 2000 nm, for example. The acoustic impedance layer may be subjected to patterning as appropriate.

Figure 4B:
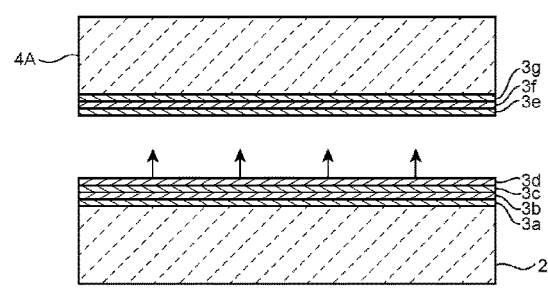

Next, the surface of the low acoustic impedance layer 3e, which will form the bonding surface for the multilayer film stacked on the piezoelectric substrate 4A, and the surface of the high acoustic impedance layer 3d, which will form the bonding surface for the multilayer film stacked on the supporting substrate 2, are polished. After polishing, as illustrated in FIG. 4B, the piezoelectric substrate 4A and the supporting substrate 2, on each of which the multilayer film is formed, are bonded to each other. For bonding the piezoelectric substrate 4A and the supporting substrate 2 to each other, a bonding film, not illustrated, in the drawing and preferably made of Ti for forming the bonding layer 9 is interposed between the low acoustic impedance layer 3e, which forms the topmost surface of the multilayer film on the piezoelectric substrate 4A, and the high acoustic impedance layer 3d, which forms the topmost surface of the multilayer film on the supporting substrate 2, and diffusion bonding is preferably performed to achieve bonding. The bonding method may be hydrophilic bonding or activated bonding.

Figure 4C:
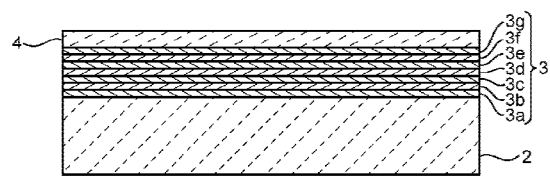

Next, as illustrated in FIG. 4C, the thickness of the piezoelectric substrate 4A is reduced so that a plate wave is excitable so as to obtain the piezoelectric substrate 4. From the viewpoint of the plate wave excitation efficiency, the thickness of the piezoelectric substrate 4 is preferably about 1 μm or less, for example.

After the thickness of the piezoelectric substrate 4A is reduced, preferably, a heat treatment is performed at a temperature of about 300° C., for example, so that the bonding film made of Ti described above is oxidized so that an insulating property is provided.

Figure 4D:
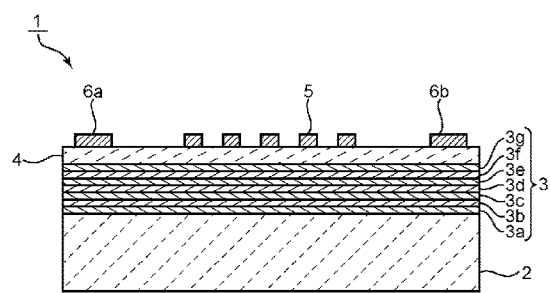

Lastly, as illustrated in FIG. 4D, an IDT electrode 5 and electrode lands 6a and 6b are formed on a main surface of the piezoelectric substrate 4, the main surface being on the opposite side from the acoustic multilayer film 3. As a result, the elastic wave device 1 is obtained.

The IDT electrode 5 and the electrode lands 6a and 6b may preferably be formed by a vapor-deposition lift-off method, for example. The thickness of the IDT electrode 5 is not particularly limited but may preferably be about 10 nm to about 2000 nm, for example. The thickness of the electrode lands 6a and 6b is not particularly limited but may preferably be about 100 nm to about 2000 nm, for example.

In the present preferred embodiment, the IDT electrode 5 is preferably formed of a multilayer metal film prepared by stacking Ti and AlCu (Cu 1%) in this order. The electrode lands 6a and 6b are each preferably formed of a multilayer metal film prepared by stacking Ti and Al in this order.

According to the production method of the present preferred embodiment, only three acoustic impedance layers are stacked on the piezoelectric substrate 4A, and, thus, large film stress does not act on the piezoelectric substrate 4A. Thus, when bonded to the supporting substrate 2, the piezoelectric substrate 4A rarely undergo warpage. This will be described through concrete Experimental Example 2.

In Experimental Example 2, in preparing the elastic wave device 1 by the production method described above, the number of acoustic impedance layers stacked on the piezoelectric substrate 4A is changed from 1 to 6.

Figure 5:
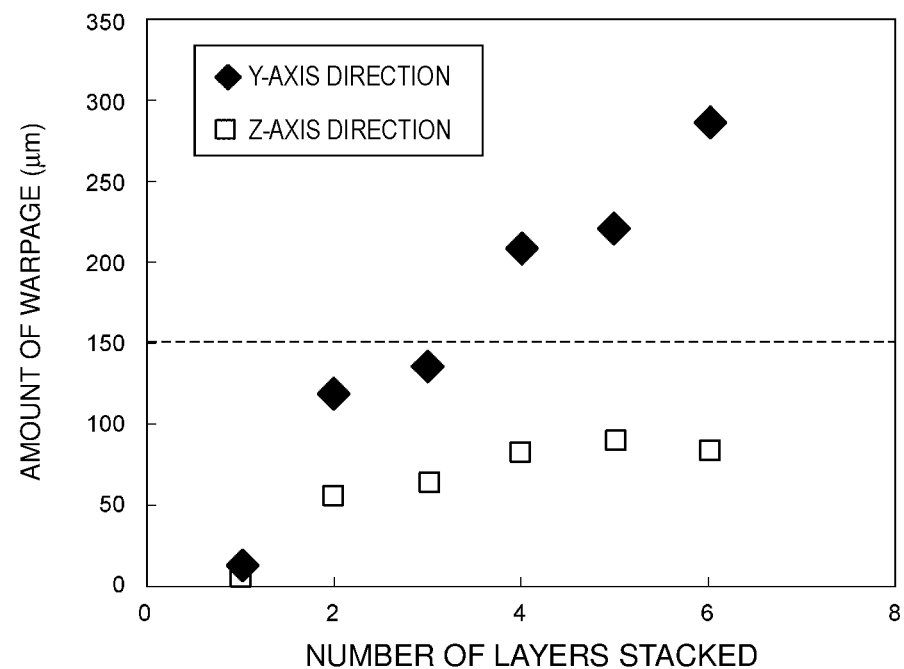
FIG. 5 is a graph illustrating the relationship between the number of acoustic impedance layers stacked and the amount of warpage of the piezoelectric substrate when an X-cut-LiNbO$_3$ substrate was used as the piezoelectric substrate in Experimental Example 2.

FIG. 5 is a graph illustrating the relationship between the number of stacked acoustic impedance layers and the amount of warpage of the piezoelectric substrate when an X-cut-$LiNbO_3$ substrate was used as the piezoelectric substrate. In FIG. 5, the number of stacked acoustic impedance layers is the number of acoustic impedance layers that are stacked on the piezoelectric substrate 4A before being bonded to the supporting substrate 2. The amount of warpage is the amount of warpage of the piezoelectric substrate 4A having a diameter of about 4 inches when the piezoelectric substrate 4A is bonded to the supporting substrate 2.

As illustrated in FIG. 5, the amount of warpage decreases as the number of acoustic impedance layers that are stacked on the piezoelectric substrate 4A decreases. In particular, when the number of stacked acoustic impedance layers is 3 or less, the amount of warpage of the piezoelectric substrate 4A remains within the range of about 150 μm or less, which is the range in which issues rarely arise in the bonding of the substrates, in the Y axis direction of the piezoelectric substrate 4A ($LiNbO_3$ substrate) as well as in the Z axis direction of the piezoelectric substrate 4A ($LiNbO_3$ substrate). In contrast, when the number of layers stacked is 4 or more, the amount of warpage in the Y axis direction is greater than about 150 μm. This shows that when four or more acoustic impedance layers are to be stacked between the piezoelectric substrate 4A and the supporting substrate 2, layers up to and including the third layer are to be stacked on the piezoelectric substrate 4A side, and other layers are to be stacked on the supporting substrate 2 side.

As such, when bonding the piezoelectric substrate 4A and the supporting substrate 2 to each other, the number of acoustic impedance layers that are stacked on the piezoelectric substrate 4A side is preferably 3 or less. In other words, in the elastic wave device 1 obtained as a product, the bonding layer 9 is preferably provided at any position in a range up to and including the interface between the third acoustic impedance layer 3e and the fourth acoustic impedance layer 3d from the piezoelectric substrate 4 side towards the supporting substrate 2 side. In such a case, since a large film stress does not act on the piezoelectric substrate 4A, warpage of the piezoelectric substrate 4A is unlikely to occur when the piezoelectric substrate 4A and the supporting substrate 2 are being bonded to each other. As a result, the piezoelectric substrate 4A and the supporting substrate 2 are able to be easily bonded to each other. Moreover, since large film stress does not act on the piezoelectric substrate 4A, stress acting on the piezoelectric substrate 4A after thickness reduction also decreases, and warpage of the piezoelectric substrate 4 after thickness reduction is also able to be reduced or prevented. Thus, in a preferred embodiment of the present invention, a piezoelectric substrate 4 warpage canceling step is not necessary. From the viewpoint of further reducing or preventing warpage of the piezoelectric substrate 4, the position of the bonding layer 9 is preferably as close to the piezoelectric substrate 4 as possible.

Note that, in the elastic wave device 1, the bonding layer 9 is not provided directly below the piezoelectric substrate 4. In other words, in the elastic wave device 1, the bonding layer 9 is absent at the interface between the piezoelectric substrate 4 and the low acoustic impedance layer 3g. Thus, the elastic wave device 1 is unlikely to undergo deterioration of the characteristics. This will now be described through Experimental Example 3.

In Experimental Example 3, an elastic wave device 1, which is a one-port-type elastic wave resonator, was prepared under the following conditions, and a $S_0$-mode plate wave was excited.

Figure 6:
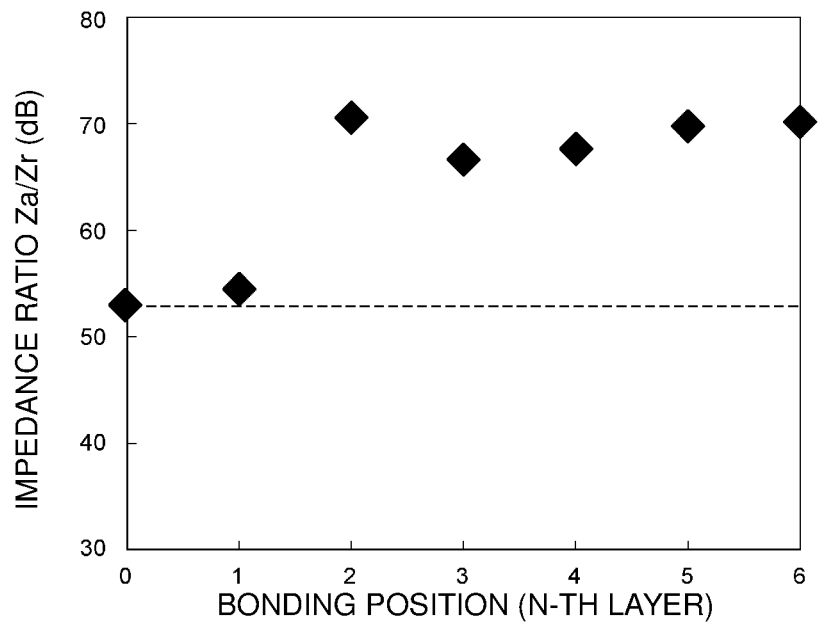
FIG. 6 is a graph showing the relationship between the bonding position of the bonding layer and the impedance ratio (Za/Zr) in Experimental Example 3.

Supporting substrate 2: Si substrate
Low acoustic impedance layer 3a: $SiO_2$, film thickness: $0.4\lambda$
High acoustic impedance layer 3b: SiN, film thickness: $0.11\lambda$
Low acoustic impedance layer 3c: $SiO_2$, film thickness: $0.1\lambda$
High acoustic impedance layer 3d: SiN, film thickness: $0.11\lambda$
Low acoustic impedance layer 3e: $SiO_2$, film thickness: $0.1\lambda$
High acoustic impedance layer 3f: SiN, film thickness: $0.11\lambda$
Low acoustic impedance layer 3g: $SiO_2$, film thickness: $0.1\lambda$ Bonding layer 9: epoxy resin, film thickness: about $0.05\lambda$
Piezoelectric substrate 4: $LiNbO_3$ {Euler angles (90°, 90°, 40°)}, film thickness: about $0.2\lambda$
IDT electrode 5: Al, film thickness: about $0.07\lambda$, duty ratio: about 0.5, wavelength ($\lambda$) determined by electrode finger pitch: about 1.0 μm FIG. 6 is a graph showing the relationship between the bonding position of the bonding layer and the impedance ratio (Za/Zr). In the graph, the bonding position of the bonding layer 9 indicates the ordinal number of the acoustic impedance layer on which the bonding layer 9 is provided as viewed from the piezoelectric substrate 4 towards the supporting substrate 2. For example, if the layer is the 0-th layer, the bonding layer 9 is provided at the interface between the piezoelectric substrate 4 and the low acoustic impedance layer 3g.

As illustrated in FIG. 6, as compared to when the bonding position is at the 0-th layer, the characteristics are improved when the bonding position is on the supporting substrate 2 side of the first layer from the piezoelectric substrate 4 side (that is, the bonding position is at the second or onward layer from the piezoelectric substrate 4).

Figure 7:
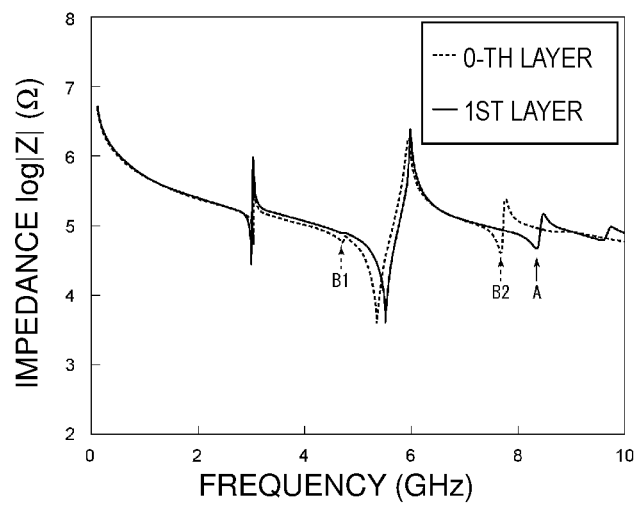
FIG. 7 is a graph illustrating resonance characteristics when the bonding layer is provided on the first acoustic impedance layer from the piezoelectric substrate side in experimental Example 3.

FIG. 7 is a graph illustrating resonance characteristics when the bonding layer is provided on the first acoustic impedance layer from the piezoelectric substrate side. In the graph, the solid line indicates the results of providing the bonding layer 9 on the acoustic impedance layer 3g, which is the first layer from the piezoelectric substrate 4 side. The broken line indicates the results of a comparative example in which the bonding layer 9 is provided on the 0-th acoustic impedance layer. In other words, the results obtained when the bonding layer 9 is provided at the interface between the piezoelectric substrate 4 and the first acoustic impedance layer 3g are shown.

As illustrated in FIG. 7, providing the bonding layer 9 on the acoustic impedance layer 3g, which is the first layer from the piezoelectric substrate 4 side, reduces or prevents the response of a spurious wave, which is indicated by arrow B1 and observed in the comparative example, near the principal wave. The graph also illustrates that the response of the spurious wave indicated by arrow A, the response corresponding to the response of the spurious wave of the comparative example indicated by arrow B2, is remote from the principal wave. This shows that when the bonding layer 9 is provided on the supporting substrate 2 side with respect to the interface between the piezoelectric substrate 4 and the first acoustic impedance layer 3g, good characteristics are obtained.

Thus, it has been discovered that as compared to when the bonding position is at the 0-th layer from the piezoelectric substrate 4 side, the characteristics are improved when the bonding position is in the first layer from the piezoelectric substrate 4 side, at the interface between the first and second layers, or on the supporting substrate 2 side with respect to the first layer.

Furthermore, as described above, in a preferred embodiment of the present invention, when bonding the piezoelectric substrate 4A and the supporting substrate 2 to each other, the amount of warpage of the piezoelectric substrate 4A is decreased because the number of acoustic impedance layers stacked on the piezoelectric substrate 4A side is 3 or less.

In view of the above, in the present preferred embodiment, the characteristics and the amount of warpage of the piezoelectric substrate are both improved by setting the bonding position to be in the range of from the inside of the first acoustic impedance layer from the piezoelectric substrate to the interface between the third acoustic impedance layer and the fourth acoustic impedance layer.

Second Preferred Embodiment

Figure 8:
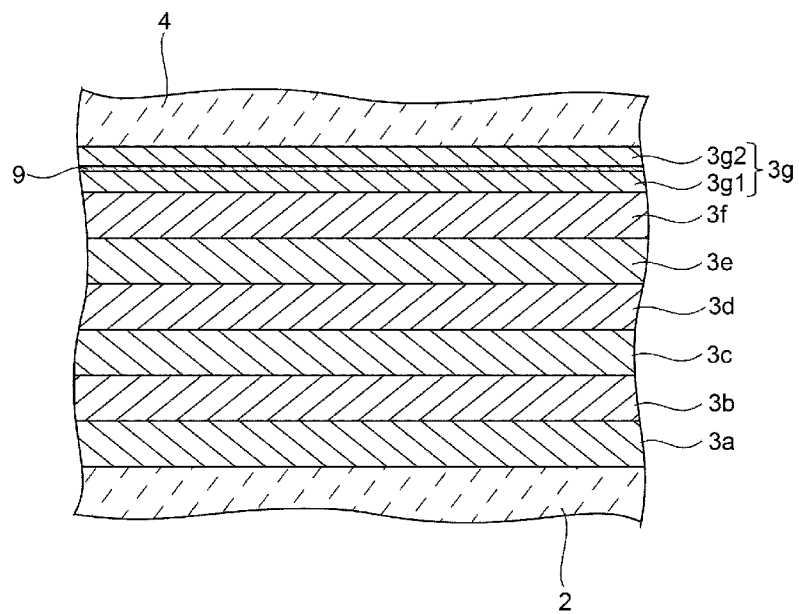
FIG. 8 is a partially cut-away schematic cross-sectional view illustrating an enlarged relevant portion of an elastic wave device of a second preferred embodiment of the present invention.

FIG. 8 is a partially cut-away schematic cross-sectional view illustrating an enlarged relevant portion of the elastic wave device of a second preferred embodiment of the present invention. As illustrated in FIG. 8, in the second preferred embodiment, the low acoustic impedance layer 3g has a structure obtained by bonding a low acoustic impedance layer segment 3g1 and a low acoustic impedance layer segment 3g2 to each other with the bonding layer 9. Thus, the bonding layer 9 is provided inside the low acoustic impedance layer 3g. The low acoustic impedance layer segment 3g1 and the low acoustic impedance layer segment 3g2 may preferably be made of the same material as that for the low acoustic impedance layers 3a, 3c, and 3e. Other features are the same or substantially the same as those of the first preferred embodiment.

The elastic wave device according to the second preferred embodiment may be produced by the same production method as that in the first preferred embodiment. Specifically, the low acoustic impedance layer segment 3g2 is stacked on the piezoelectric substrate 4A, and other portions are stacked on the supporting substrate 2. Then, the low acoustic impedance layer segment 3g2 on the piezoelectric substrate 4A and the low acoustic impedance layer segment 3g1, which is the topmost layer of the multilayer film on the supporting substrate 2, are bonded together by the same or substantially the same method as in the first preferred embodiment to produce the elastic wave device.

In the second preferred embodiment, since the bonding layer is provided inside the first acoustic impedance layer from the piezoelectric substrate side towards the supporting substrate side, warpage of the piezoelectric substrate and deterioration of the characteristics are unlikely to occur.

As in the elastic wave device of the second preferred embodiment, the bonding layer 9 may be provided inside any of the first to third acoustic impedance layers from the piezoelectric substrate 4 side towards the supporting substrate 2 side. Furthermore, as in the elastic wave device of the first preferred embodiment, the bonding layer 9 may be provided at the interface between any two adjacent acoustic impedance layers among the first to fourth acoustic impedance layers from the piezoelectric substrate 4 side towards the supporting substrate 2 side. As described above, in preferred embodiments of the present invention, since the bonding layer is provided at any position in the range of from inside the first acoustic impedance layer, which is the first layer from the piezoelectric substrate side towards the supporting substrate side, to the interface between the third and fourth acoustic impedance layers, warpage of the piezoelectric substrate and deterioration of the characteristics is unlikely to occur.

Elastic wave devices of preferred embodiments of the present invention are widely used in various electronic appliances and communication appliances. An example of the electronic appliances is a sensor. Examples of the communication appliances include a duplexer that includes an elastic wave device according to a preferred embodiment of the present invention, a communication module appliance that includes an elastic wave device according to a preferred embodiment of the present invention, and a power amplifier (PA) and/or a low noise amplifier (LNA) and/or a switch (SW), and a mobile communication appliance and a healthcare communication appliance that include the communication module appliance. Examples of the mobile communication appliance include cellular phones, smart phones, and car navigation systems. Examples of the healthcare communication appliance include a body weight meter and a body fat meter. The healthcare communication appliance and the mobile communication appliance each include an antenna, an RF module, an LSI, a display, an input unit, a power supply, and other components.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a supporting substrate;
   an acoustic multilayer film on the supporting substrate;
   a piezoelectric substrate on the acoustic multilayer film; and
   an IDT electrode on the piezoelectric substrate;
   wherein
   an absolute value of a thermal expansion coefficient of the piezoelectric substrate is larger than an absolute value of a thermal expansion coefficient of the supporting substrate;
   the acoustic multilayer film includes at least four acoustic impedance layers;
   the at least four acoustic impedance layers include at least one low acoustic impedance layer and at least one high acoustic impedance layer having an acoustic impedance higher than the low acoustic impedance layer;
   the at least one low acoustic impedance layer and the at least one high acoustic impedance layer are laminated alternately; and
   a bonding layer is provided at any position in a range of from inside a first acoustic impedance layer of the at least four acoustic impedance layers from the piezoelectric substrate side towards the supporting substrate side, to an interface between a third acoustic impedance layer and a fourth acoustic impedance layer of the at least four acoustic impedance layers.

2. The elastic wave device according to claim 1, wherein the bonding layer is provided inside one acoustic impedance layer selected from the first acoustic impedance layer, the second acoustic impedance layer, and the third acoustic impedance layer of the at least four acoustic impedance layers from the piezoelectric substrate side towards the supporting substrate side.

3. The elastic wave device according to claim 1, wherein the bonding layer is provided at an interface between any two adjacent acoustic impedance layers among the at least four acoustic impedance layers from the piezoelectric substrate side toward the supporting substrate side.

4. The elastic wave device according to claim 1, wherein a plate wave of an $S_0$ mode, an $A_0$ mode, an $A_1$ mode, an $SH_0$ mode, or an $SH_1$ mode is used as a propagating elastic wave.

5. The elastic wave device according to claim 1, wherein the bonding layer has a thickness of about 5 nm or less.

6. The elastic wave device according to claim 1, wherein the bonding layer also defines and functions as an insulating layer.

7. The elastic wave device according to claim 1, wherein the supporting substrate is made of glass or Si, and the piezoelectric substrate is made of $LiNbO_3$ or $LiTaO_3$.

8. The elastic wave device according to claim 1, wherein the low acoustic impedance layer is made of silicon oxide.

9. The elastic wave device according to claim 1, wherein the high acoustic impedance layer is made of tungsten, platinum, tantalum, silicon nitride, or aluminum nitride.

10. The elastic wave device according to claim 1, wherein a thickness of each of the acoustic impedance layers is in a range of about ¼ of a thickness of the piezoelectric substrate to about 10 times the thickness of the piezoelectric substrate.

11. The elastic wave device according to claim 1, wherein the bonding layer is made of a Ti oxide or a Ti nitride.

12. The elastic wave device according to claim 1, wherein the IDT electrode is made of at least one of Al, Cu, Pt, Au, Ag, Ti, Ni, Cr, Mo, or W, or an alloy primarily including any of Al, Cu, Pt, Au, Ag, Ti, Ni, Cr, Mo, or W.

13. The elastic wave device according to claim 1, wherein the IDT electrode is made of Al.

14. The elastic wave device according to claim 1, wherein the IDT electrode is defined by a multilayer metal film including a Ti layer and an AlCu that are stacked on one another.

15. The elastic wave device according to claim 1, further comprising electrode lands provided on the piezoelectric substrate.

16. The elastic wave device according to claim 15, wherein the electrode layers are defined by a multilayer metal film including a Ti layer and an Al layer that are stacked on one another.

17. The elastic wave device according to claim 1, wherein a thickness of the IDT electrode is about 10 nm to about 2000 nm.

18. The elastic wave device according to claim 15, wherein a thickness of each of the electrode lands is about 100 nm to about 2000 nm.

\* \* \* \* \*